(12) United States Patent
Chen et al.

(10) Patent No.: US 9,928,888 B1
(45) Date of Patent: Mar. 27, 2018

(54) LOW POWER CONSUMPTION MEMORY DEVICE

(71) Applicant: Taiwan Semiconductor Manufacturing Company Limited, Hsinchu (TW)

(72) Inventors: Yi-Tzu Chen, Hsinchu (TW); Anjana Singh, Hsinchu (TW); Che-Ju Yeh, Kaohsiung (TW); Hau-Tai Shieh, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/273,744

(22) Filed: Sep. 23, 2016

(51) Int. Cl.
| | | |
|---|---|---|
| *G11C 11/4091* | (2006.01) | |
| *G11C 7/12* | (2006.01) | |
| *G11C 5/06* | (2006.01) | |
| *G11C 7/06* | (2006.01) | |

(52) U.S. Cl.
CPC ............... *G11C 7/12* (2013.01); *G11C 5/06* (2013.01); *G11C 7/06* (2013.01)

(58) Field of Classification Search
CPC ........................................... G11C 7/12
USPC .......................................... 365/203
See application file for complete search history.

(56) References Cited

U.S. PATENT DOCUMENTS

| | | | | |
|---|---|---|---|---|
| 5,625,592 A | * | 4/1997 | Shinozaki | G11C 7/1048 365/189.14 |
| 2010/0027327 A1 | * | 2/2010 | Chung | G11C 8/10 365/163 |
| 2010/0202189 A1 | * | 8/2010 | Jung | G11C 7/02 365/149 |
| 2011/0063892 A1 | * | 3/2011 | Kajigaya | G11C 7/065 365/149 |
| 2011/0205820 A1 | * | 8/2011 | Takayama | G11C 11/4091 365/200 |
| 2011/0305099 A1 | * | 12/2011 | Sharma | G11C 7/12 365/203 |
| 2013/0070506 A1 | * | 3/2013 | Kajigaya | G11C 7/18 365/51 |
| 2013/0155798 A1 | * | 6/2013 | Kajigaya | G11C 7/065 365/208 |
| 2013/0176791 A1 | * | 7/2013 | Sakakibara | G11C 16/3459 365/185.21 |
| 2013/0201753 A1 | * | 8/2013 | Adams | G11C 7/18 365/154 |
| 2015/0243355 A1 | * | 8/2015 | Lee | G11C 13/0069 365/148 |

\* cited by examiner

*Primary Examiner* — Min A Huang
(74) *Attorney, Agent, or Firm* — Jones Day

(57) ABSTRACT

A memory device includes a memory cell, a local bit line, a data line, first and second pass gate circuits, and a sense amplifier. The local bit line is coupled to the memory cell. The first pass gate circuit is coupled to the local bit line and the data line and is configured to couple the local bit line to the data line. The second pass gate circuit is coupled to the data line and the global bit line and is configured to couple the data line to the global bit line. The sense amplifier is coupled to the data line.

20 Claims, 10 Drawing Sheets

LOW POWER CONSUMPTION MEMORY DEVICE

BACKGROUND

A conventional memory device includes a memory cell, a local bit line, a global bit line, a word line, a pass gate circuit, a pre-charger, and a cross-coupled p-channel metal-oxide semiconductor field-effect transistors (MOSFETs) circuit. Prior to a write operation of the memory device, the pre-charger pre-charges the local bit line to a high voltage level, e.g., a level of a source voltage at which the memory device is operated. Thereafter, the local bit line is left floating at the high voltage level.

During a write operation of the memory device, a low voltage level, e.g., a level of a ground voltage of the memory device, is first provided to the global bit line. Then, the pass gate circuit electrically couples the local bit line to the global bit line. This transfers the low voltage level from the global bit line to the local bit line. This, in turn, pulls the local bit line from the high voltage level towards the low voltage level. Subsequently, the cross-coupled p-channel MOSFETs circuit pulls the local bit line to the low voltage level. At this time, the word line is activated, whereby a bit '0' of data is written to the memory cell. Such a write operation consumes a large amount of power.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
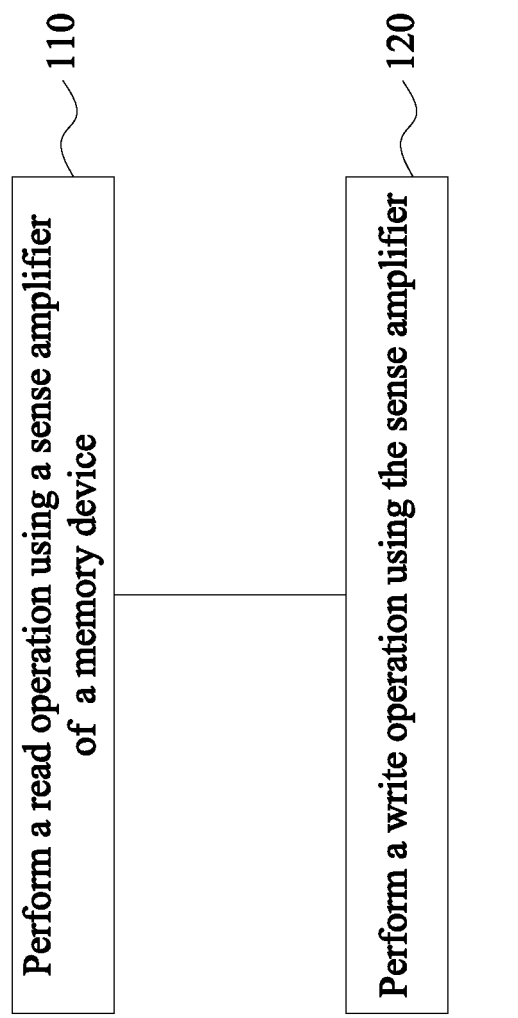
FIG. 1 is a flow chart of an exemplary method of performing read and write operations in a memory device according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a memory device that includes a read circuit unit and a write circuit unit. The read circuit unit includes a sense amplifier that senses a difference between levels of voltages on complementary data lines of the memory device and that amplifies the difference sensed thereby. As will be described in detail herein, the write circuit unit exploits the sense amplifier of the read circuit unit so as to conserve power consumption of the memory device.

A flow chart of an exemplary method of performing read and write operations in a memory device, according to some embodiments, is illustrated in FIG. 1. The memory device includes complementary data lines, e.g., complementary data lines (DL, DLB) of FIG. 5, complementary first global bit lines, e.g., complementary global bit lines (RGBL, RGBLB) of FIG. 5, complementary second global bit lines, e.g., complementary global bit lines (WGBL, WGBLB) of FIG. 5, complementary local bit lines, e.g., complementary local bit lines (BL, BLB) of FIG. 5, a memory cell, a pre-charger, a read circuit unit, and a write circuit unit. Prior to operation 110, the data lines are pre-charged by the pre-charger to a high voltage level, e.g., a level of a source voltage at which the memory device is operated. In operation 110, a read is performed on the memory cell using a sense amplifier of the read circuit unit. In some embodiments, operation 110 includes the sense amplifier sensing a difference between levels of voltages on the data lines and amplifying the difference sensed thereby, i.e., pulling one of the data lines to a low voltage level, e.g., a level of a reference voltage of the memory device. In some embodiments, operation 110 includes transferring the low and high voltage levels from the data lines to the first global bit lines, respectively, whereby complementary bits of data are read from the memory cell.

Prior to operation 120, the data lines are pre-charged by the pre-charger to the high voltage level. In operation 120, a write is performed on the memory cell using the sense amplifier of the read circuit unit. In some embodiments, operation 120 includes transferring a low power consumption voltage from one of the second global bit lines to one of the data lines. The low power consumption voltage has a level lower than the high voltage level but higher than the low voltage level and in some embodiments is generated by a voltage generating circuit of the write circuit unit. In some embodiments, operation 120 includes the sense amplifier sensing a difference between levels of voltages on the data lines and amplifying the difference sensed thereby, i.e., pulling one of the data lines to the low voltage level. In some embodiments, operation 120 includes transferring the high and low voltage levels from the data lines to the local bit lines, respectively, whereby complementary bits of data are written to the memory cell.

Figure 2:
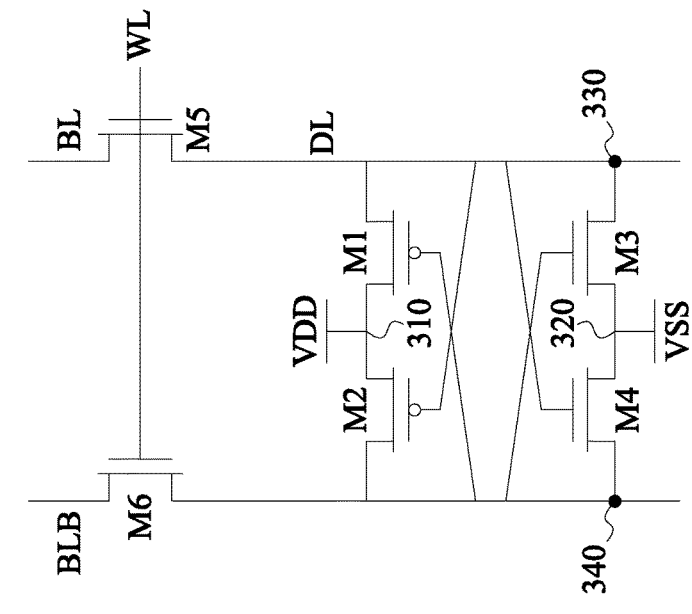
FIG. 2 is a schematic diagram of an exemplary memory device according to some embodiments.

A schematic diagram of an exemplary memory device 200, according to some embodiments, is illustrated in FIG. 2. The memory device 200 includes complementary data lines (DL, DLB), complementary global bit lines (RGBL, RGBLB), complementary global bit lines (WGBL, WGBLB), complementary local bit lines (BL, BLB), a memory cell 210, a read circuit unit, and a write circuit unit. In this exemplary embodiment, the memory device 200 is implemented using metal-oxide semiconductor field-effect transistors (MOSFETs). It should be understood that a MOSFET has first and second source/drain terminals and a gate terminal. In an alternative embodiment, the memory device 200 may be implemented with any type of transistor. In some embodiments, the memory device 200 is a static random access memory (SRAM) device. In other embodiments, the memory device 200 is a dynamic RAM (DRAM) device.

Figure 3:
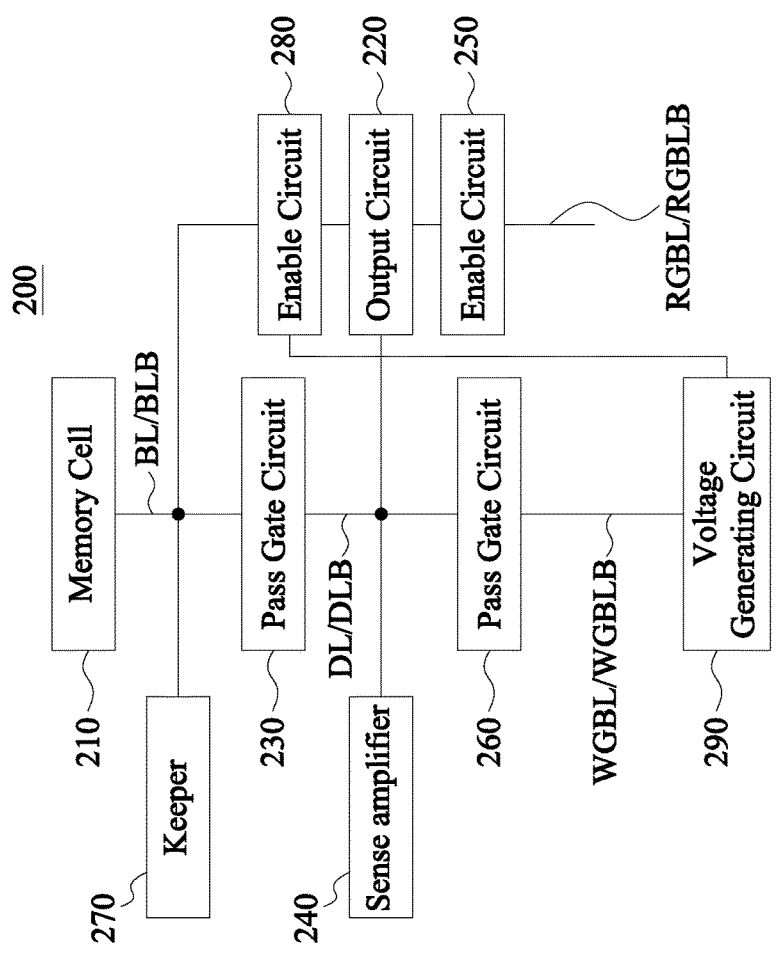
FIG. 3 is a schematic diagram of an exemplary memory cell of the memory device according to some embodiments.

The memory cell 210 is connected to the local bit lines (BL, BLB) and is configured to store complementary bits of data therein. A schematic diagram of an exemplary memory cell 210 of the memory device 200, according to some embodiments, is illustrated in FIG. 3. In this exemplary embodiment, the memory cell 210 is a six-transistor (6T) memory cell and includes a source voltage node 310, a reference voltage node 320, memory cell nodes 330, 340, p-channel MOSFETs (M1, M2), and n-channel MOSFETs (M3, M4, M5, M6). The memory cell 210 is configured to store a bit '0' or a low voltage level, i.e., a level of a reference voltage (VSS), e.g., 0 V, applied at the reference voltage node 320, and a bit '1' or a high voltage level, i.e., a level of a source voltage (VDD), e.g., 1 V, applied at the source voltage node 310. In some embodiments, the memory cell 210 may include any number of MOSFETs. In other embodiments, the memory cell 210 may have other configurations so long as it can store complementary bits of data therein.

The p-channel MOSFETs (M1, M2) and the n-channel MOSFETs (M3, M4) constitute a latch. The first source/drain terminals of the p-channel MOSFETs (M1, M2) are connected to each other and to the source voltage node 310. The first source/drain terminals of the n-channel MOSFETs (M3, M4) are connected to each other and to the reference voltage node 320. The second source/drain terminals of the p-channel and n-channel MOSFETs (M1, M3) and the gate terminals of the p-channel and n-channel MOSFETs (M2, M4) are connected to each other and to the memory cell node 330. The second source/drain terminals of the p-channel and n-channel MOSFETs (M2, M4) and the gate terminals of the p-channel and n-channel MOSFETs (M1, M3) are connected to each other and to the memory cell node 340.

The first source/drain terminals of the n-channel MOSFETs (M5, M6) are respectively connected to the local bit lines (BL, BLB). The second source/drain terminals of the n-channel MOSFETs (M5, M6) are respectively connected to the memory cell nodes 330, 340. The memory device 200 further includes a word line (WL). The gate terminals of the n-channel MOSFETs (M5, M6) are connected to each other and to the word line (WL).

Figure 4B:
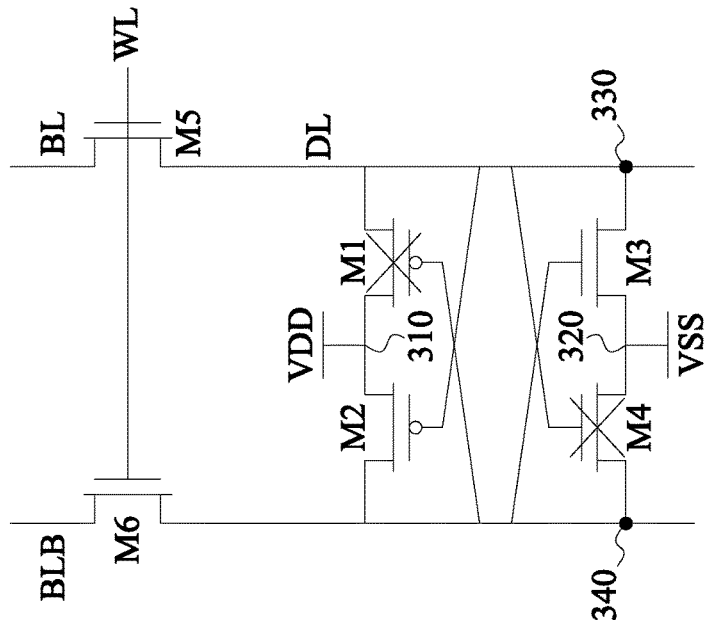
FIGS. 4A and 4B are schematic diagrams of the memory cell during a read/write operation of the memory device according to some embodiments.
Figure 4A:
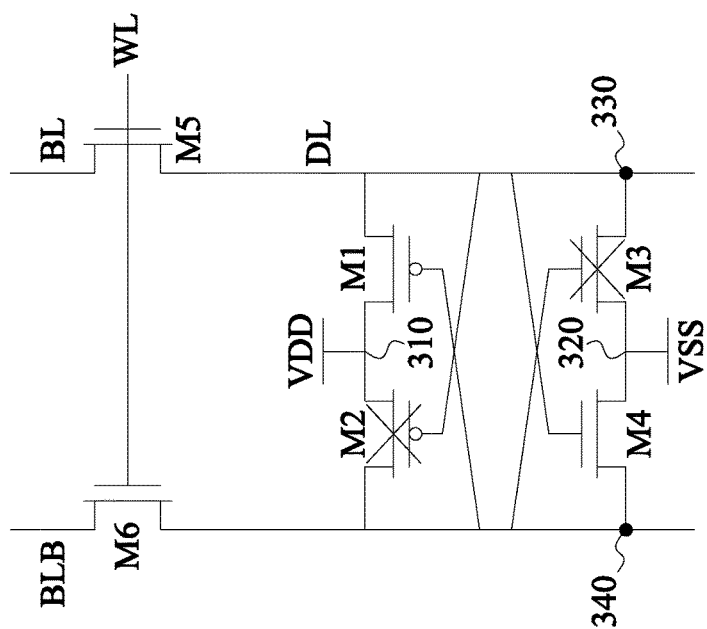

Schematic diagrams of the memory cell 210 during a read/write operation of the memory device 200, according to some embodiments, are illustrated in FIGS. 4A and 4B. As illustrated in FIG. 4A, during a read operation, in which bits '1' and '0' are respectively latched/stored in the memory cell nodes 330, 340, the p-channel and n-channel MOSFETs (M1, M4) are turned on. The p-channel and n-channel MOSFETs (M2, M3) are turned off and are therefore crossed out in FIG. 4A. At this time, when a voltage on the word line (WL) transitions from the low voltage level to the high voltage level, i.e., when the word line (WL) is activated, the n-channel MOSFETs (M5, M6) are turned on and connect electrically and respectively the local bit lines (BL, BLB) to the memory cell nodes 330, 340. As a result, the bits '1' and '0' are respectively transferred from the memory cell nodes 330, 340 to the local bit lines (BL, BLB), whereby complementary bits of data are read from the memory cell 210.

As illustrated in FIG. 4B, during another read operation of the memory device 200, in which bits '0' and '1' are respectively stored in the memory cell nodes 330, 340, the p-channel and n-channel MOSFETs (M2, M3) are turned on. The p-channel and n-channel MOSFETs (M1, M4) are turned off and are therefore crossed out in FIG. 4B. At this time, when the word line (WL) is activated, the n-channel MOSFETs (M5, M6) are turned on and connect electrically and respectively the local bit lines (BL, BLB) to the memory cell nodes 330, 340. As a result, the bits '0' and '1' are respectively transferred from the memory cell nodes 330, 340 to the local bit lines (BL, BLB), whereby complementary bits of data are read from the memory cell 210.

Referring back to FIG. 4A, during a write operation of the memory device 200, in which bits '1' and '0' are respectively on the local bit lines (BL, BLB), when the word line (WL) is activated, the n-channel MOSFETs (M5, M6) are turned on and connect electrically and respectively the local bit lines (BL, BLB) to the memory cell nodes 330, 340. As a result, the bits '1' and '0' are respectively transferred from the local bit lines (BL, BLB) to the memory cell nodes 330, 340. At this time, the p-channel and n-channel MOSFETs (M1, M4) are turned on and the p-channel and n-channel MOSFETs (M2, M3) are turned off, whereby complementary bits of data are written to the memory cell 210.

Referring now to FIG. 4B, during another write operation of the memory device 200, in which bits '0' and '1' are respectively on the local bit lines (BL, BLB), when the word line (WL) is activated, the n-channel MOSFETs (M5, M6) are turned on and connect electrically and respectively the local bit lines (BL, BLB) to the memory cell nodes 330, 340. As a result, the bits '0' and '1' are respectively transferred from the local bit lines (BL, BLB) to the memory cell nodes 330,340. At this time, the p-channel and n-channel MOSFETs (M2, M3) are turned on and the p-channel and n-channel MOSFETs (M1, M4) are turned off, whereby complementary bits of data are written to the memory cell 210.

It should be understood that the memory device 200 may include a plurality of banks, each of which includes a plurality of the memory cells 210 that are arranged in rows and columns.

Referring back to FIG. 2, the memory device 200 further includes an output circuit 220 connected to the data lines (DL, DLB) and configured to generate an output voltage, a level of which corresponds to a voltage level on the data line (DL/DLB).

The read circuit unit includes a pass gate circuit 230, a sense amplifier 240, and an enable circuit 250. The pass gate circuit 230 is connected to the local bit lines (BL, BLB) and the data lines (DL, DLB) and is configured to electrically and respectively connect the local bit lines (BL, BLB) to the data lines (DL, DLB). The sense amplifier 240 is connected to the data lines (DL, DLB) and is configured to sense a difference between levels of voltages on the data lines (DL, DLB) and to amplify the difference sensed thereby. The enable circuit 250 is connected to the output circuit 220 and the global bit lines (RGBL, RGBLB) and is configured to provide the output voltage generated by the output circuit 220 to the global bit line (RGBL/RGBLB).

Figure 5:
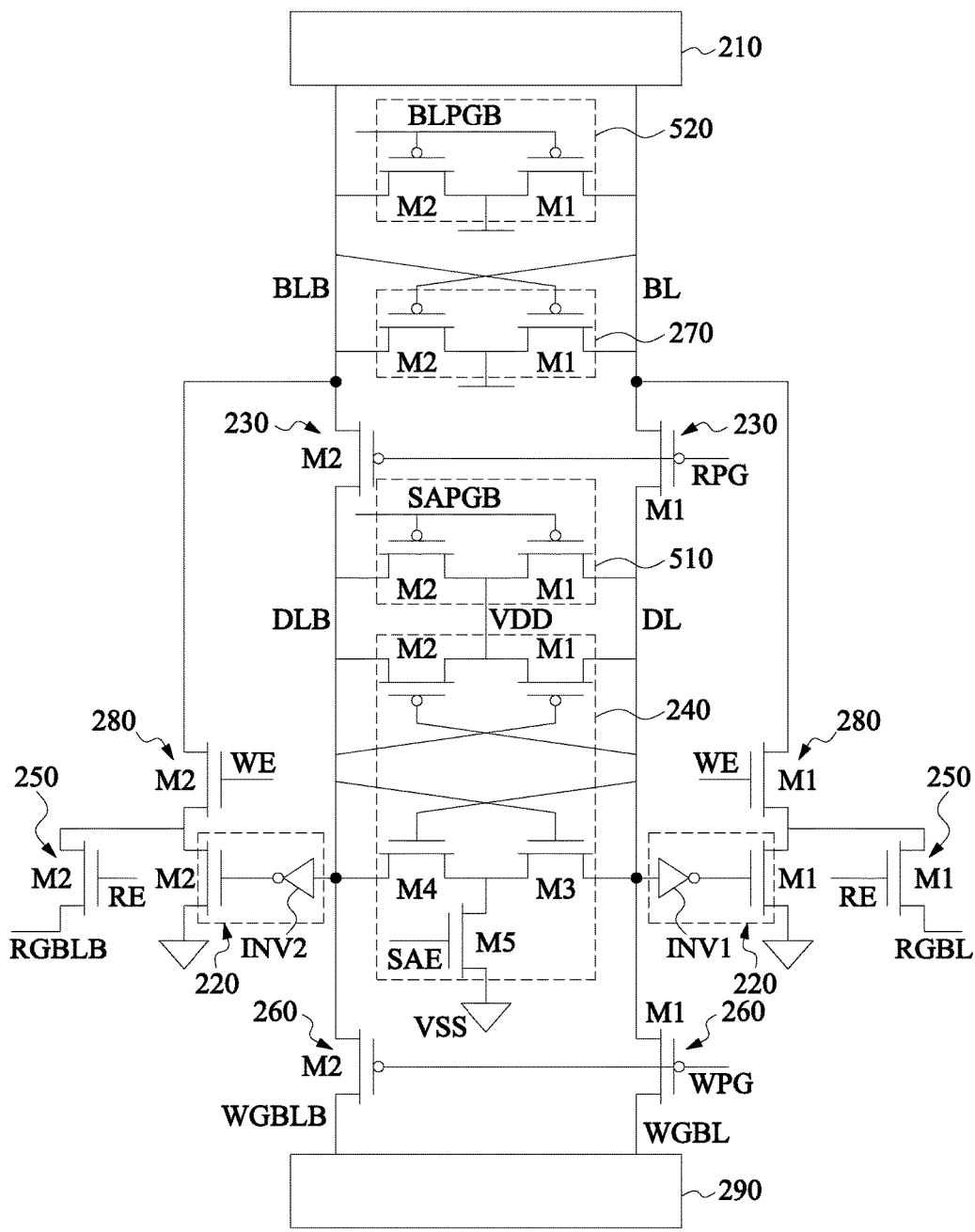
FIG. 5 is a schematic diagram of an exemplary read/write circuit unit of the memory device according to some embodiments.

A schematic diagram of an exemplary read/write circuit unit of the memory device 200, according to some embodiments, is illustrated in FIG. 5. The output circuit 220 includes n-channel MOSFETs (M1, M2) and inverters (INV1, INV2) respectively between the data line (DL) and the gate terminal of the n-channel MOSFET (M1) thereof and between the data line (DLB) and the gate terminal of the n-channel MOSFET (M2) thereof The pass gate circuit 230 includes an enable node (RPG) and p-channel MOSFETs (M1, M2). The first source/drain terminals of the p-channel MOSFETs (M1, M2) of the pass gate circuit 230 are respectively connected to the local bit lines (BL, BLB). The second source/drain terminals of the p-channel MOSFETs (M1, M2) of the pass gate circuit 230 are respectively connected to the data lines (DL, DLB). The gate terminals of the p-channel MOSFETs (M1, M2) of the pass gate circuit 230 are connected to each other and to the enable node (RPG).

The sense amplifier 240 includes an enable node (SAE), p-channel MOSFETs (M1, M2), and n-channel MOSFETs (M3, M4, M5). The first source/drain terminals of the p-channel MOSFETs (M1, M2) of the sense amplifier 240 are connected to each other and to the source voltage node 310. The first source/drain terminals of the n-channel MOSFETs (M3, M4, M5) of the sense amplifier 240 are connected to each other. The second source/drain terminal and the gate terminal of the n-channel MOSFET (M5) of the sense amplifier 240 are respectively connected to the reference voltage node 320 and the enable node (SAE). The second source/drain terminals of the p-channel and n-channel MOSFETs (M1, M3) and the gate terminals of the p-channel and n-channel MOSFETs (M2, M4) of the sense amplifier 240 are connected to each other and to the data line (DL). The second source/drain terminals of the p-channel and n-channel MOSFETs (M2, M4) and the gate terminals of the p-channel and n-channel MOSFETs (M1, M3) of the sense amplifier 240 are connected to each other and to the data line (DLB).

The enable circuit 250 includes an enable node (RE) and n-channel MOSFETs (M1, M2). The first source/drain terminals of the n-channel MOSFETs (M1, M2) of the enable circuit 250 are respectively connected to the first source/drain terminals of the n-channel MOSFETs (M1, M2) of the output circuit 220. The second source/drain terminals of the n-channel MOSFETs (M1, M2) of the enable circuit 250 are respectively connected to the global bit lines (RGBL, RGBLB). The gate terminals of the n-channel MOSFETs (M1, M2) of the enable circuit 250 are connected to each other and to the enable node (RE). The gate terminals of the n-channel MOSFETs (M1, M2) of the enable circuit 250 are connected to each other and to the enable node (RE). The second source/drain terminals of the n-channel MOSFETs (M1, M2) of the output circuit 220 are connected to each other and to the reference voltage node 320.

The memory device 200 further includes a pre-charger 510 connected to the data lines (DL, DLB) and configured to pre-charge the data lines (DL, DLB) to the high voltage level. In this exemplary embodiment, the pre-charger 510 includes an enable node (SAPGB) and p-channel MOSFETs (M1, M2). The first source/drain terminals of the p-channel MOSFETs (M1, M2) of the pre-charger 510 are connected to each other and to the source voltage node 310. The second source/drain terminals of the p-channel MOSFETs (M1, M2) of the pre-charger 510 are respectively connected to the data lines (DL, DLB). The gate terminals of the p-channel MOSFETs (M1, M2) of the pre-charger 510 are connected to each other and to the enable node (SAPGB).

Figure 6A:
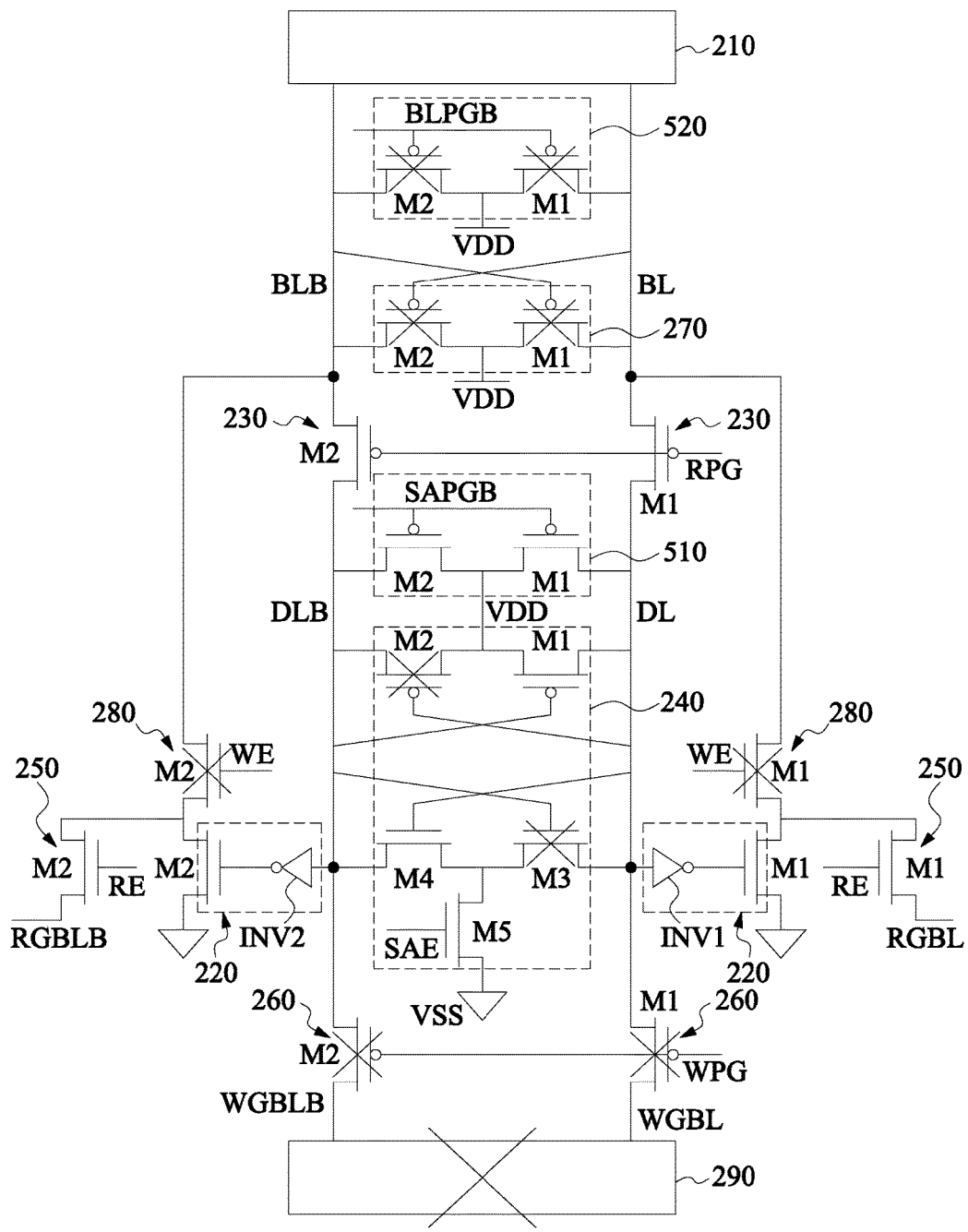
FIGS. 6A and 6B are schematic diagrams of the read circuit unit during a read operation of the memory device according to some embodiments.
Figure 6B:
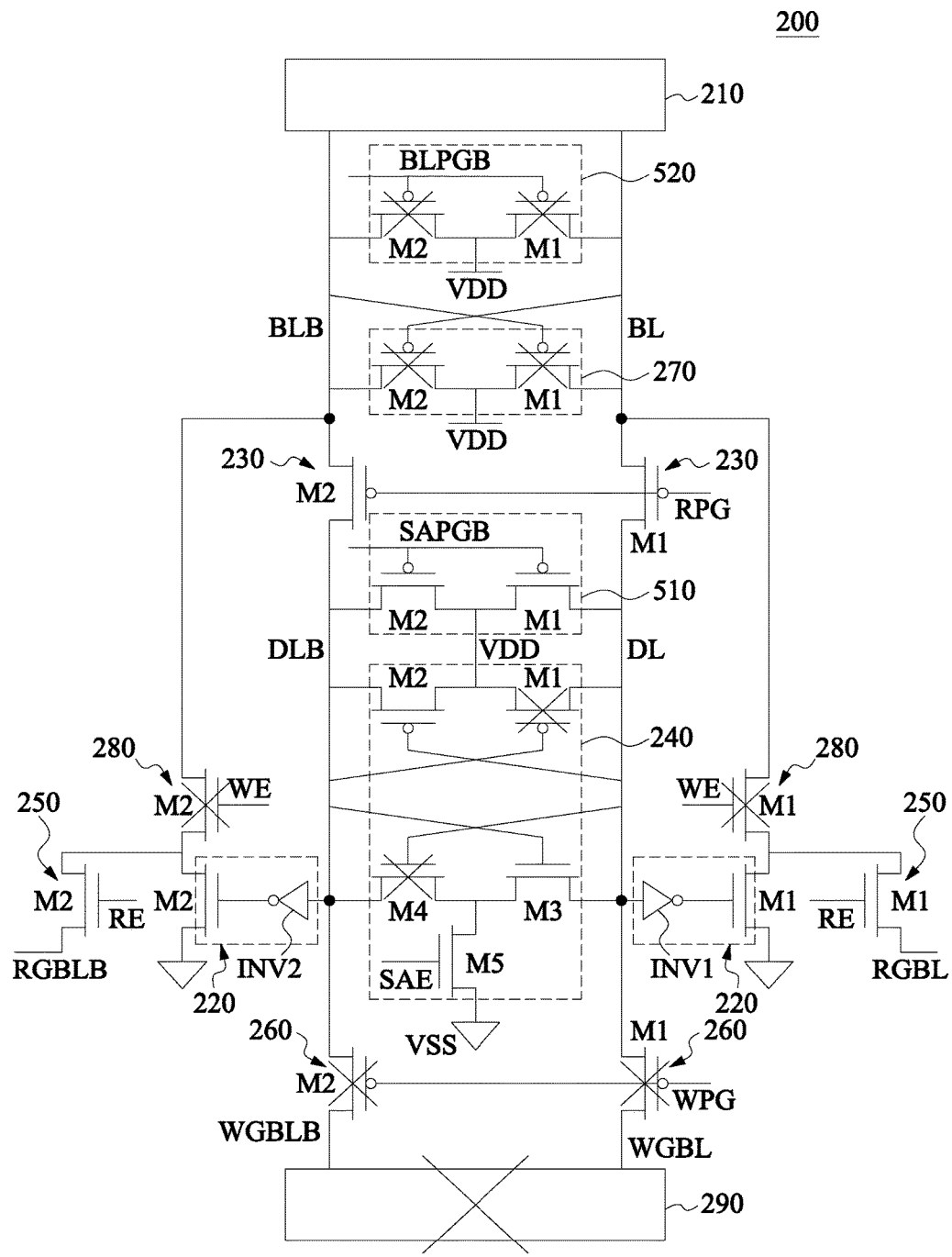

Schematic diagrams of the read circuit unit during a read operation of the memory device 200, according to some embodiments, are illustrated in FIGS. 6A and 6B. Prior to a read operation, when a voltage at the enable node (SAPGB) transitions from the high voltage level to the low voltage level, the p-channel MOSFETs (M1, M2) of the pre-charger 510 are turned on. As a result, the data lines (DL, DLB) are pre-charged to the high voltage level. Subsequently, when the voltage at the enable node (SAPGB) transitions from the low voltage level back to the high voltage level, the p-channel MOSFETs (M1, M2) of the pre-charger 510 are turned off. As a result, the data lines (DL, DLB) are left floating at the high voltage level.

As illustrated in FIG. 6A, during a read operation of the memory device 200, in which bits '1' and '0' are respectively latched/stored in the memory cell nodes 330, 340 of the memory cell 210, when a voltage at the enable node (RPG) transitions from the high voltage level to the low voltage level, the p-channel MOSFETs (M1, M2) of the pass gate circuit 230 are turned on and connect respectively and electrically the local bit lines (BL, BLB) to the data lines (DL, DLB). At this time, the word line (WL) is activated. As a result, the bits '1' and '0' are respectively transferred from the local bit lines (BL, BLB) to the data lines (DL, DLB). This pulls the data line (DLB) towards the low voltage level. As this occurs, the data line (DL) stays at the high voltage level. The p-channel and n-channel MOSFETs (M2, M3) of the sense amplifier 240 are turned off and are therefore crossed out in FIG. 6A.

When the sense amplifier 240 senses that a difference between the levels of the voltages on the data lines (DL, DLB) is greater than a threshold voltage, e.g., 100 mV, a voltage at the enable node (SAE) transitions from the low voltage level to the high voltage level. This pulls the data line (DLB) to the low voltage level. At this time, a voltage at the enable node (RE) is at the high voltage level. As a result, the low level voltage is transferred from the data line (DLB) to the global bit line (RGBLB) by the output circuit 220 through the n-channel MOSFET (M2) of the enable circuit 250, whereby complementary bits of data are read from the memory cell 210.

As illustrated in FIG. 6B, during another read operation of the memory device 200, in which bits '0' and '1' are respectively stored in the memory cell nodes 330, 340 of the memory cell 210, when a voltage at the enable node (RPG) transitions from the high voltage level to the low voltage level, the p-channel MOSFETs (M1, M2) of the pass gate circuit 230 are turned on and connect respectively and electrically the local bit lines (BL, BLB) to the data lines (DL, DLB). At this time, the word line (WL) is activated. As a result, the bits '0' and '1' are respectively transferred from the local bit lines (BL, BLB) to the data lines (DL, DLB). This pulls the data line (DL) towards the low voltage level. As this occurs, the data line (DLB) stays at the high voltage level. The p-channel and n-channel MOSFETs (M1, M4) of the sense amplifier 240 are turned off and are therefore crossed out in FIG. 6B.

When the sense amplifier 240 senses that a difference between the levels of the voltages on the data lines (DL, DLB) is greater than a threshold voltage, e.g., 100 mV, a voltage at the enable node (SAE) transitions from the low voltage level to the high voltage level. This pulls the data line (DL) to the low voltage level. At this time, a voltage at the enable node (RE) is at the high voltage level. As a result, the low level voltage is transferred from the data line (DL) to the global bit line (RGBL) by the output circuit 220 through the n-channel MOSFET (M1) of the enable circuit 250, whereby complementary bits of data are read from the memory cell 210.

Referring back to FIG. 2, the write circuit unit includes a pass gate circuit 260, a keeper 270, an enable circuit 280, and a voltage generating circuit 290. The pass gate circuit 260 is connected to the data lines (DL, DLB) and the global bit lines (WGBL, WGBLB) and is configured to electrically and respectively connect the data lines (DL, DLB) to the global bit lines (WGBL, WGBLB). The keeper 270 is connected to the local bit lines (BL, BLB) and is configured in this exemplary embodiment as a cross-coupled p-channel MOSFETs circuit. The enable circuit 280 is connected to the local bit lines (BL, BLB) and the output circuit 220 and is configured to provide the output voltage generated by the output circuit 220 to the local bit line (BL/BLB).

The voltage generating circuit 290 is connected to the global bit lines (WGBL, WGBLB) and the enable circuit 280 and is configured to provide on the global bit line (WGBL/WGBLB) a low power consumption voltage, a level of which, e.g., 900 mV, is lower than the high voltage level, e.g., 1 V, but higher than the low voltage level, e.g., 0 V.

Referring now to FIG. 5, the pass gate circuit 260 includes an enable node (WPG) and p-channel MOSFETs (M1, M2). The first source/drain terminals of the p-channel MOSFETs (M1, M2) of the pass gate circuit 260 are respectively connected to the data lines (DL, DLB). The second source/drain terminals of the p-channel MOSFETs (M1, M2) of the pass gate circuit 260 are respectively connected to the global bit lines (WGBL, WGBLB). The gate terminals of the p-channel MOSFETs (M1, M2) of the pass gate circuit 260 are connected to each other and to the enable node (WPG).

The keeper 270 includes p-channel MOSFETs (M1, M2). The first source/drain terminals of the p-channel MOSFETs (M1, M2) of the keeper 270 are connected to each other and to the source voltage node 310. The second source/drain terminal of the p-channel MOSFET (M1) and the gate terminal of the p-channel MOSFET (M2) of the keeper 270 are connected to each other and to the local bit line (BL). The second source/drain terminal of the p-channel MOSFET (M2) and the gate terminal of the p-channel MOSFET (M1) of the keeper 270 are connected to each other and to the local bit line (BLB).

The enable circuit 280 includes an enable node (WE) and n-channel MOSFETs (M1, M2). The first source/drain terminals of the n-channel MOSFETs (M1, M2) of the enable circuit 280 are respectively connected to the local bit lines (BL, BLB). The second source/drain terminals of the n-channel MOSFETs (M1, M2) of the enable circuit 280 are respectively connected to the first source/drain terminals of the n-channel MOSFETs (M1, M2) of the output circuit 220. The gate terminals of the n-channel MOSFETs (M1, M2) of the enable circuit 280 are connected to each other and to the enable node (WE).

The memory device 200 further includes a pre-charger 520 connected to the local bit lines (BL, BLB) and configured to pre-charge the local bit lines (BL, BLB) to the high voltage level. In this exemplary embodiment, the pre-charger 520 includes an enable node (BLPGB) and p-channel MOSFETs (M1, M2). The first source/drain terminals of the p-channel MOSFETs (M1, M2) of the pre-charger 520 are connected to each other and to the source voltage node 310. The second source/drain terminals of the p-channel MOSFETs (M1, M2) of the pre-charger 520 are respectively connected to the local bit lines (BL, BLB). The gate terminals of the p-channel MOSFETs (M1, M2) of the pre-charger 520 are connected to each other and to the enable node (BLPGB).

Figure 7A:
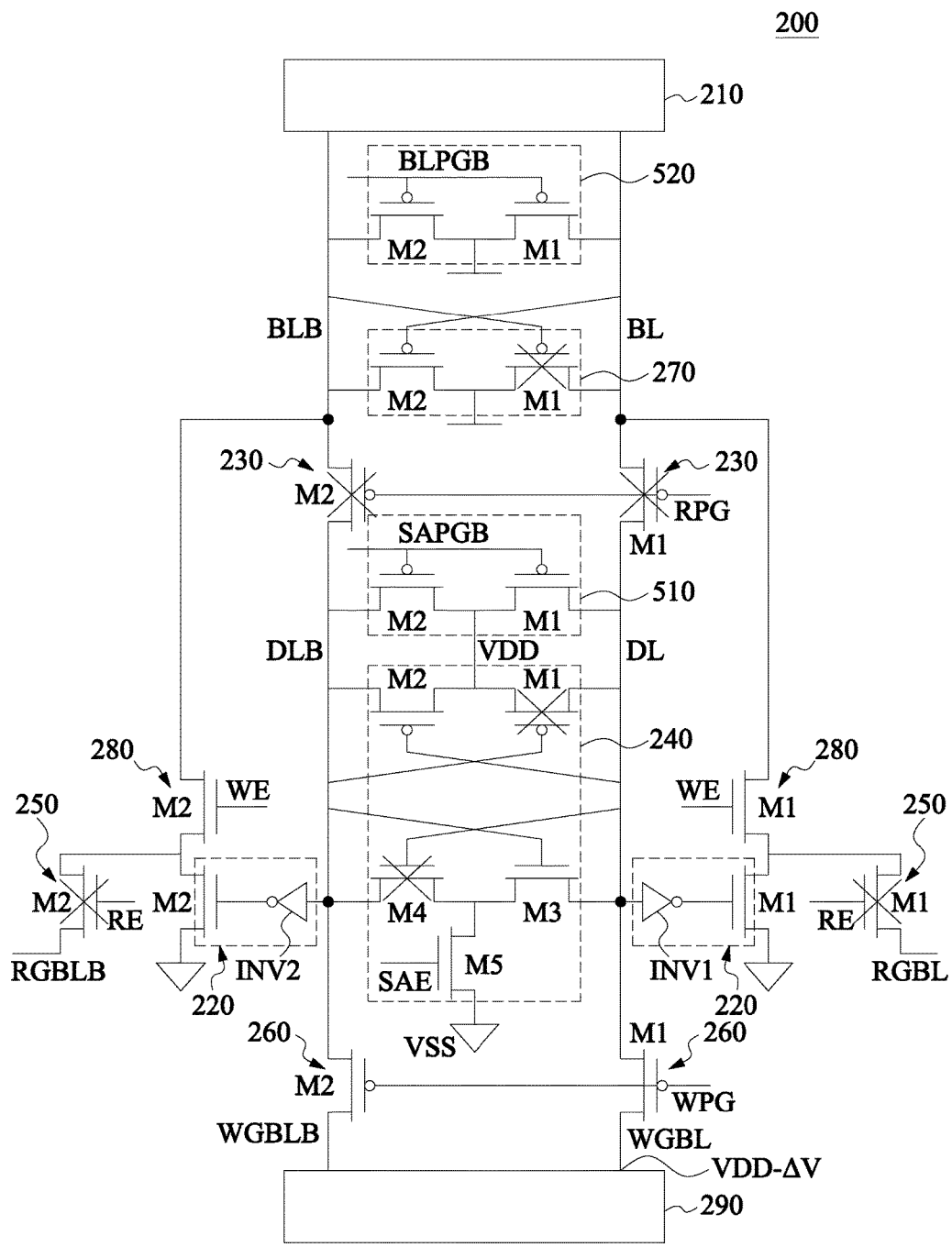
FIGS. 7A and 7B are schematic diagrams of the write circuit unit during a write operation of the memory device according to some embodiments.
Figure 7B:
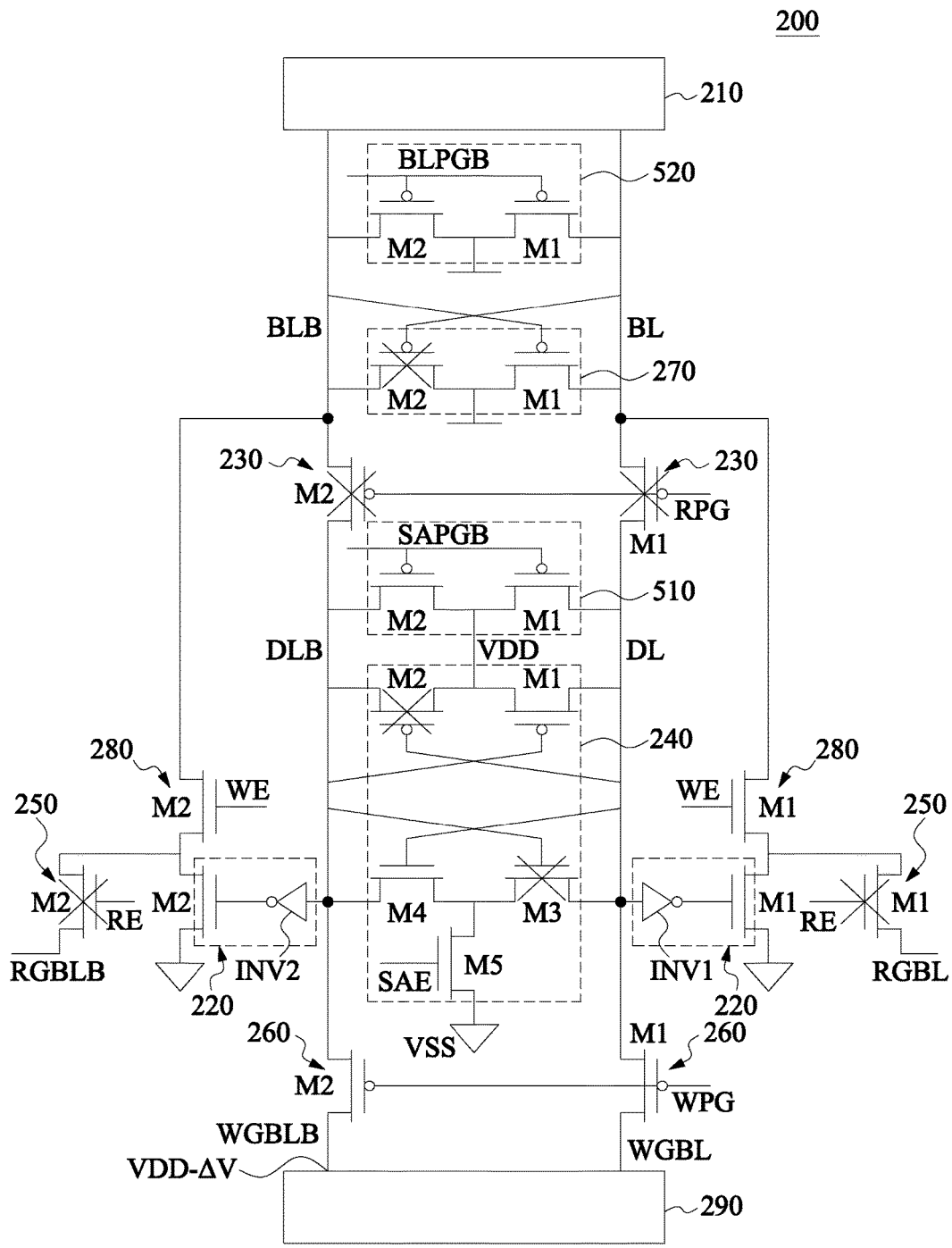

Schematic diagrams of the write circuit unit during a write operation of the memory device 200, according to some embodiments, are illustrated in FIGS. 7A and 7B. Prior to a write operation, when voltages at the enable nodes (BLPGB, SAPGB) transition from the high voltage level to the low voltage level, the p-channel MOSFETs (M1, M2) of the pre-chargers 510, 520 are turned on. As a result, the local bit lines (BL, BLB) and the data lines (DL, DLB) are pre-charged to the high voltage level. Subsequently, when the voltages at the enable nodes (BLPGB, SAPGB) transition from the low voltage level back to the high voltage level, the p-channel MOSFETs (M1, M2) of the pre-chargers 510, 520 are turned off. As a result, the local bit lines (BL, BLB) and the data lines (DL, DLB) are left floating at the high voltage level. The global bit lines (WGBL, WGBLB) are also pre-charged to the high voltage level prior to a write operation as will be described below in conjunction with FIG. 8.

As illustrated in FIG. 7A, during a write operation of the memory device 200, in which the voltage generating circuit 290 provides on the global bit line (WGBL) a low power consumption voltage (VDD-ΔV), a level of which, e.g., 900 mV, is lower than the high voltage level, e.g., 1 V, but higher than the low voltage level, e.g., 0 V, when a voltage at the enable node (WPG) transitions from the high voltage level to the low voltage level, the p-channel MOSFETs (M1, M2) of the pass gate circuit 260 are turned on and connect respectively and electrically the data lines (DL, DLB) to the global bit lines (WGBL, WGBLB). This transfers the low power consumption voltage level from the global bit line (WGBL) to the data line (DL). This, in turn, pulls the data line (DL) towards the low power consumption voltage level. As this occurs, the data line (DLB) stays at the high voltage level. The p-channel and n-channel MOSFETs (M1, M4) of the sense amplifier 240 are turned off and are therefore crossed out in FIG. 7A. The pass gate circuit 230 and the enable circuit 250 of the read circuit unit are not in operation and the MOSFETs (M1, M2) thereof are also crossed out in FIG. 7A.

When the sense amplifier 240 senses that a difference between the levels of the voltages on the data lines (DL, DLB) is greater than a threshold, e.g., 100 mV, a voltage at the enable node (SAE) transitions from the low voltage level to the high voltage level. This pulls the data line (DL) to the low voltage level. At this time, the enable node (WE) is at the high voltage level. As a result, the low voltage level is transferred from the data line (DL) to the local bit line (BL) by the output circuit 220 through the n-channel MOSFET (M1) of the enable circuit 280. This pulls the local bit line (BL) to the low voltage level. This, in turn, keeps the local bit line (BLB) at the high voltage level. The p-channel MOSFET (M1) of the keeper 270 is turned off and is therefore crossed out in FIG. 7A. At this time, the word line (WL) is activated, whereby complementary bits of data are written to the memory cell 210.

As illustrated in FIG. 7B, during another write operation of the memory device 200, in which the voltage generating circuit 290 provides the low power consumption voltage (VDD-ΔV) on the global bit line (WGBLB), when a voltage at the enable node (WPG) transitions from the high voltage level to the low voltage level, the p-channel MOSFETs (M1, M2) of the pass gate circuit 260 are turned on and connect respectively and electrically the data lines (DL, DLB) to the global bit lines (WGBL, WGBLB). This transfers the low power consumption voltage level from the global bit line (WGBLB) to the data line (DLB). This, in turn, pulls the data line (DLB) towards the low power consumption voltage level. As this occurs, the voltage on the data line (DL) stays at the high voltage level. The p-channel and n-channel MOSFETs (M2, M3) of the sense amplifier 240 are turned off and are therefore crossed out in FIG. 7B. The pass gate circuit 230 and the enable circuit 250 of the read circuit unit are not in operation and the MOSFETs (M1, M2) thereof are also crossed out in FIG. 7B.

When the sense amplifier 240 senses that a difference between the levels of the voltages on the data lines (DL, DLB) is greater than a threshold, e.g., 100 mV, a voltage at the enable node (SAE) transitions from the low voltage level to the high voltage level. This pulls the data line (DLB) to the low voltage level. At this time, the enable node (WE) is at the high voltage level. As a result, the low voltage level is transferred from the data line (DLB) to the local bit line (BLB) by the output circuit 220 through the n-channel MOSFET (M2) of the enable circuit 280. This pulls the local bit line (BLB) to the low voltage level. This, in turn, keeps the local bit line (BL) at the high voltage level. The p-channel MOSFET (M2) of the keeper 270 is turned off and is therefore crossed out in FIG. 7B. At this time, the word line (WL) is activated, whereby complementary bits of data are written to the memory cell 210.

Figure 8:
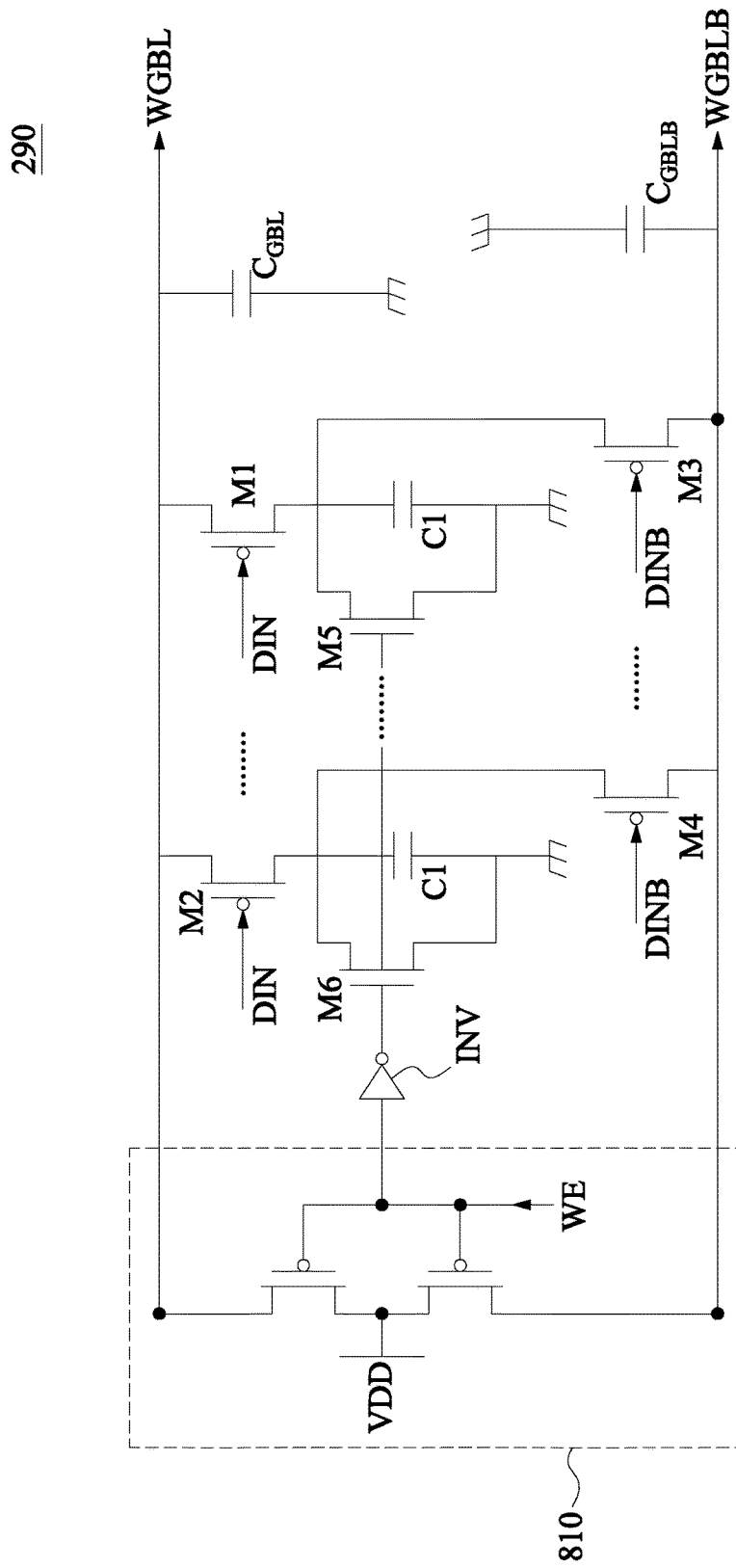
FIGS. 8 and 9 are schematic diagrams of exemplary voltage generating circuits of the memory device according to some embodiments.

A schematic diagram of an exemplary voltage generating circuit 290 of the write circuit unit of the memory device 200, according to some embodiments, is illustrated in FIG. 8. As illustrated in FIG. 8, the voltage generating circuit 290 is connected to the global bit lines (WGBL, WGBLB) and the enable node (WE) and includes input nodes (DIN, DINB), capacitors (C1), an inverter (INV), and p-channel and n-channel MOSFETs (M1, M2, M3, M4, M5, M6).

In operation, when it is desired to write a bit '0' to the memory cell node 330, i.e., a bit '1' to the memory cell node 340, low and high voltage levels are respectively applied to the input nodes (DIN, DINB). This turns the p-channel MOSFETs (M1, M2) on and the p-channel MOSFETs (M3, M4) off. Subsequently, when a voltage at the enable node (WE) transitions from the low voltage level to the high voltage level, the n-channel MOSFETs (M5, M6) are turned off. As a result, a low power consumption voltage (VDD-ΔV), a level of which, e.g., 900 mV, is lower than the high voltage level, e.g., 1 V, but higher than the low voltage level, e.g., 0 V, is provided on the global bit line (WGBL). At this time, the ΔV is calculated using the equation, $$\text{VDD}/(1+(C_{GBL}/(N*C1)))$$

where $C_{GBL}$ is the parasitic capacitance of the global bit line (WGBL), C1 is the capacitance of the capacitor C1, and N is the number of the capacitors C1.

Conversely, when it is desired to write a bit '0' to the memory cell node 340, i.e., a bit "1" to the memory cell node 330, low and high voltage levels are respectively applied to the input nodes (DINB, DIN). This turns the p-channel MOSFETs (M3, M4) on and the p-channel MOSFETs (M1, M2) off. Subsequently, when the voltage at the enable node (WE) transitions from the low voltage level to the high voltage level, the n-channel MOSFETs (M5, M6) are turned off. As a result, a low power consumption voltage (VDD-ΔV), a level of which, e.g., 900 mV, is lower than the high voltage level, e.g., 1 V, but higher than the low voltage level, e.g., 0 V, is provided on the global bit line (WGBLB). At this time, the ΔV is calculated using the equation, $$\text{VDD}/(1+(C_{GBLB}/(N*C1)))$$

where $C_{GBLB}$ is the parasitic capacitance of the global bit line (WGBLB).

In this exemplary embodiment, the voltage generating circuit 290 further includes a pre-charger 810 connected to the source voltage node 310, the global bit lines (WGBL, WGBLB), the enable node (WE), and the inverter (INV). In operation, when the enable node (WE) is at the low voltage level, i.e., prior to write operations of the memory device 200, the pre-charger 810 connects the global bit lines (WGBL, WGBLB) to the source voltage node 310. As a result, the pre-charger 810 pre-charges the global bit lines (WGBL, WGBLB) to the high voltage level. Thereafter, when the voltage at the enable node (WE) transitions to the high voltage level, the global bit lines (WGBL, WGBLB) are left floating at the high voltage level.

Figure 9:
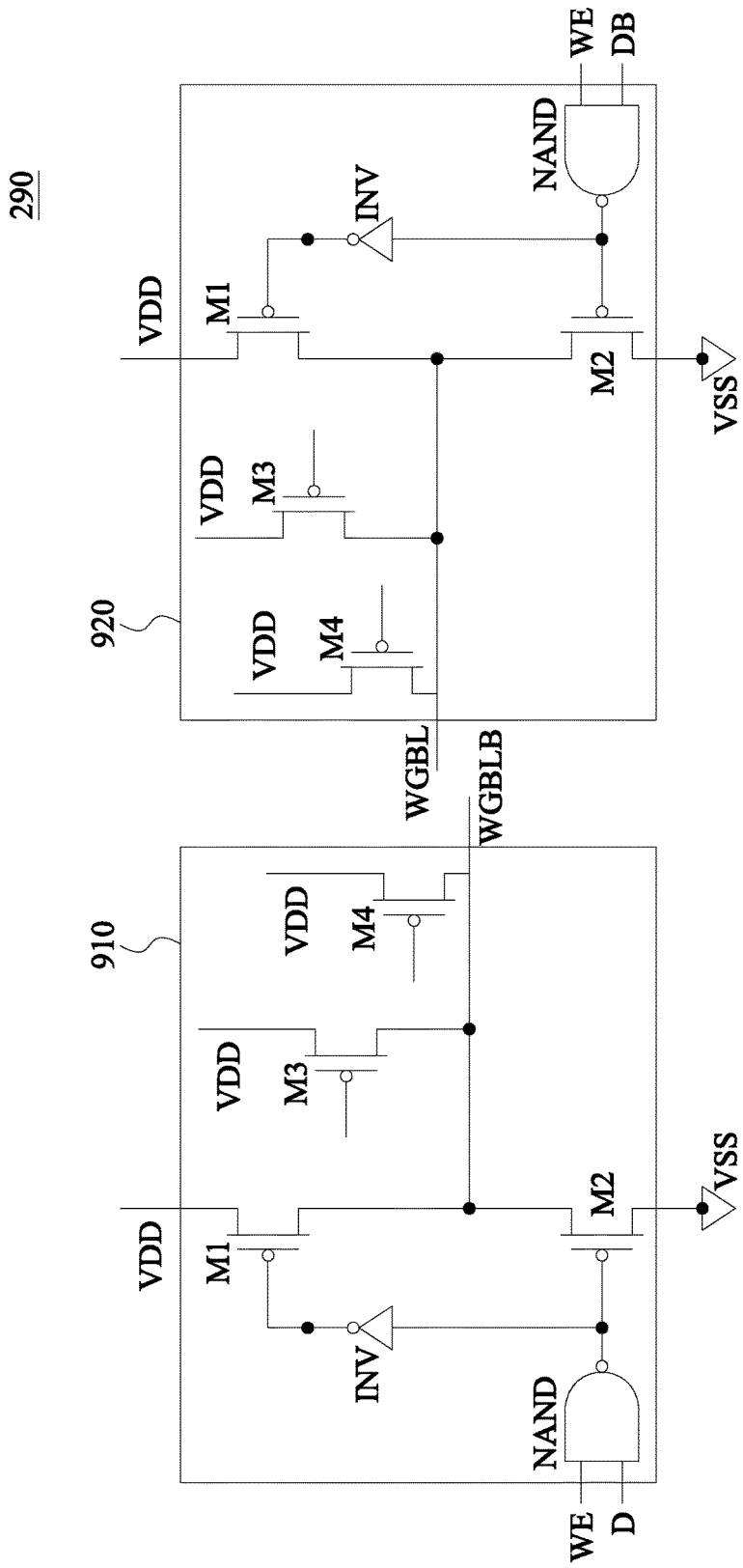

It should be understood that other configurations for the voltage generating circuit 290 may be used to generate the low power consumption voltage (VDD-ΔV). A schematic diagram of another exemplary voltage generating circuit 290 of the write circuit unit of the memory device 200, according to some embodiments, is illustrated in FIG. 9. As illustrated in FIG. 9, the voltage generating circuit 290 includes input nodes (D, DB), and a pair of circuit modules 910, 920, each of which is connected to a respective one of the input nodes (D, DB), a respective one of the global bit lines (WGBLB, WGBL), and the enable node (WE). In this exemplary embodiment, each of the circuit modules 910, 920 includes a NAND gate (NAND), an inverter (INV), and p-channel MOSFETs (M1, M2, M3, M4).

In operation, when it is desired to write a bit '0' to the memory cell node 330, i.e., a bit '1' to the memory cell node 340, low and high voltage levels are respectively applied to the input nodes (D, DB). Subsequently, when a voltage at the enable node (WE) transitions from the low voltage level to the high voltage level, the p-channel MOSFETs (M1, M2) of the circuit module 920 are turned off and on, respectively. At this time, at least one of the p-channel MOSFETs (M3, M4) of the circuit module 920 is turned on. As a result, a low power consumption voltage (VDD-ΔV), a level of which, e.g., 900 mV, is lower than the high voltage level, e.g., 1 V, but higher than the low voltage level, e.g., 0 V, is provided on the global bit line (WGBL).

Conversely, when it is desired to write a bit '1' to the memory cell node 330, i.e., a bit "0" to the memory cell node 340, low and high voltage levels are respectively applied to the input nodes (DB, D). Subsequently, when a voltage at the enable node (WE) transitions from the low voltage level to the high voltage level, the p-channel MOSFETs (M1, M2) of the circuit module 910 are turned off and on, respectively. At this time, at least one of the p-channel MOSFETs (M3, M4) of the circuit module 910 is turned on. As a result, a low power consumption voltage (VDD-ΔV), a level of which, e.g., 900 mV, is lower than the high voltage level, e.g., 1 V, but higher than the low voltage level, e.g., 0 V, is provided on the global bit line (WGBLB).

From the above description, the memory device 200 of the present disclosure comprises a write circuit unit including a pass gate circuit 260 configured to connect electrically and respectively data lines (DL, DLB) to global bit lines (WGBL, WGBLB), and a read circuit unit including a pass gate circuit 230 configured to connect electrically and respectively local bit lines (BL, BLB) to data lines (DL, DLB) and a sense amplifier 240 connected to the pass gate circuits 230, 260. The construction as such permits usage of the sense amplifier 240 of the read circuit unit by the write circuit unit during write operations of the memory device 200, whereby a low power consumption voltage (VDD-ΔV) can be applied to the global bit line (WGBL/WGBLB) during the write operations, thereby reducing power consumption of the memory device 200, e.g., by up to 56%.

In an exemplary embodiment, a memory device comprises a memory cell, a local bit line coupled to the memory cell, a data line, a first pass gate circuit coupled to the local bit line and the data line and configured to couple the local bit line to the data line, a global bit line, a second pass gate circuit coupled to the data line and the global bit line and configured to couple the data line to the global bit line, and a sense amplifier coupled to the data line.

In another exemplary embodiment, a memory device comprises a memory cell, a local bit line coupled to the memory cell, a data line, a pass gate circuit coupled to the local bit line and the data line and configured to couple the local bit line to the data line, an output circuit coupled to the data line and configured to generate an output voltage level that corresponds to a voltage level on the data line, and an enable circuit coupled to the local bit line and the output circuit and configured to provide the output voltage level to the local bit line.

In another exemplary embodiment, a memory device comprises a memory cell configured to store low and high voltage levels therein, a local bit line coupled to the memory cell, a data line, a first pass gate circuit coupled to the local bit line and the data line and configured to couple the local bit line to the data line, a global bit line, a second pass gate circuit coupled to the data line and the global bit line and configured to couple the data line to the global bit line, and a voltage generating circuit coupled to the global bit line and configured to provide on the global bit line a low power consumption voltage level lower than the high voltage level but higher than the low voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device comprising:
    a memory cell configured to store low and high voltage levels therein;
    a local bit line coupled to the memory cell;
    a data line;
    a first pass gate circuit coupled to the local bit line and the data line and configured to couple the local bit line to the data line;
    a global bit line;
    a second pass gate circuit coupled to the data line and the global bit line and configured to couple the data line to the global bit line; and
    a voltage generating circuit coupled to the global bit line and configured to provide on the global bit line a low power consumption voltage level lower than a high voltage level but higher than a low voltage level, the low power consumption voltage level being used during a write operation to identify data to be written to the memory cell.

2. The memory device of claim 1, further comprising a sense amplifier coupled to the data line.

3. The memory device of claim 1, further comprising an output circuit coupled to the data line and configured to generate an output voltage level that corresponds to a voltage level on the data line.

4. The memory device of claim 3, further comprising an enable circuit coupled to the local bit line and the output circuit and configured to provide the output voltage level to the local bit line.

5. The memory device of claim 4, wherein the enable circuit is further coupled to the voltage generating circuit.

6. The memory device of claim 4, further comprising a pre-charger coupled to the global bit line and the enable circuit and configured to pre-charge the global bit line to the high voltage level.

7. The memory device of claim 3, further comprising:
    a second global bit line; and
    an enable circuit coupled to the output circuit and the second global bit line and configured to provide the output voltage level to the second global bit line.

8. The memory device of claim 1, further comprising a pre-charger coupled to the local bit line and configured to pre-charge the local bit line to the high voltage level.

9. The memory device of claim 1, further comprising a pre-charger coupled to the data line and configured to pre-charge the data line to the high voltage level.

10. A memory device comprising:
    a memory cell configured to store complementary bits of data;
    a pair of local bit lines coupled to the memory cell;
    a pair of data lines;
    a first pass gate circuit coupled to a local bit line of the pair of local bit lines and a data line of the pair of data lines and configured to couple to the local bit line to the data line;
    a pair of global bit lines;
    a second pass gate circuit coupled to the data line and a global bit line of the pair of global bit lines and configured to couple the data line to the global bit line; and
    a voltage generating circuit coupled to the pair of global bit lines and configured to provide on the pair of global bit lines a low power consumption voltage level lower than a high voltage level but higher than a low voltage level, the low power consumption voltage level being used during a write operation to identify data to be written to the memory cell.

11. The memory device of claim 10, further comprising a sense amplifier coupled to the pair of data lines.

12. The memory device of claim 10, further comprising an output circuit coupled to the data line and configured to generate an output voltage level that corresponds to a voltage level on the data line.

13. The memory device of claim 12, further comprising an enable circuit coupled to the local bit line and the output circuit and configured to provide the output voltage level to the local bit line.

14. The memory device of claim 13, wherein the enable circuit is further coupled to the voltage generating circuit.

15. The memory device of claim 13, further comprising a pre-charger coupled to the pair of global bit lines and the enable circuit and configured to pre-charge the pair of global bit lines to the high voltage level.

16. The memory device of claim 12, further comprising:
another enable circuit coupled to the output circuit and another global bit line of the pair of global bit lines and configured to provide the output voltage level to the another global bit line.

17. The memory device of claim 10, further comprising a pre-charger coupled to the pair of local bit lines and configured to pre-charge the local bit line to the high voltage level.

18. The memory device of claim 10, further comprising a pre-charger coupled to the pair of data lines and configured to pre-charge the pair of data lines to the high voltage level.

19. A memory device comprising:
a memory cell;
a local bit line coupled to the memory cell;
a data line;
a first pass gate circuit coupled to the local bit line and the data line and configured to couple the local bit line to the data line;
a global bit line;
a second pass gate circuit coupled to the data line and the global bit line and configured to couple the data line to the global bit line;
a voltage generating circuit coupled to the global bit line and configured to provide on the global bit line a low power consumption voltage level lower than a high voltage level but higher than a low voltage level, the low power consumption voltage level being used during a write operation to identify data to be written to the memory cell; and
a keeper circuit coupled to the local bit line.

20. The memory device of claim 19, wherein the keeper circuit comprises at least two transistors coupled to each other.

* * * * *